United States Patent
Manes

(10) Patent No.: US 10,249,175 B2
(45) Date of Patent: Apr. 2, 2019

(54) PUSH PLATE OF MANUAL ALARM DEVICE

(71) Applicant: GULF SECURITY TECHNOLOGY COMPANY LIMITED, Hebei (CN)

(72) Inventor: Enrico Manes, Feeding Hills, MA (US)

(73) Assignee: GULF SECURITY TECHNOLOGY COMPANY LIMITED, Hebei (CN)

( * ) Notice: Subject to any disclaimer, the term of this patent is extended or adjusted under 35 U.S.C. 154(b) by 57 days.

(21) Appl. No.: 15/268,065

(22) Filed: Sep. 16, 2016

(65) Prior Publication Data

US 2017/0084165 A1 Mar. 23, 2017

(30) Foreign Application Priority Data

Sep. 18, 2015 (CN) .......................... 2015 1 0596532

(51) Int. Cl.
 *G08B 25/12* (2006.01)
 *H05K 5/02* (2006.01)
 *H01H 3/02* (2006.01)

(52) U.S. Cl.
 CPC ........... *G08B 25/12* (2013.01); *H05K 5/0221* (2013.01); *H01H 2003/024* (2013.01); *H01H 2003/0233* (2013.01); *H01H 2003/0246* (2013.01)

(58) Field of Classification Search
 CPC ................. G08B 25/12; H05K 5/0221; H01H 2003/0233; H01H 2003/0246; H01H 2003/024
 See application file for complete search history.

(56) References Cited

U.S. PATENT DOCUMENTS

| | | | |
|---|---|---|---|
| 4,280,120 A | 7/1981 | Trafford et al. | |
| 4,404,445 A * | 9/1983 | Baran | H01H 3/022 200/314 |
| 4,857,679 A | 8/1989 | Bennett et al. | |
| 5,055,643 A * | 10/1991 | Pardini | H01H 3/022 200/302.2 |
| 5,760,678 A * | 6/1998 | Pavlacka | G08B 25/12 340/287 |
| 8,432,266 B2 * | 4/2013 | Varieur | G08B 17/02 200/331 |
| 2004/0207935 A1 * | 10/2004 | Jim | G02B 25/02 359/802 |
| 2014/0116865 A1 | 5/2014 | Leong et al. | |
| 2015/0339913 A1 * | 11/2015 | Lyman | G08B 25/12 340/287 |

FOREIGN PATENT DOCUMENTS

| | | |
|---|---|---|
| CN | 101159087 A | 4/2008 |
| CN | 204178526 U | 2/2015 |

(Continued)

OTHER PUBLICATIONS

EP Communication; Extended European Search Report; Application No. 16189212.0-1810; dated Mar. 28, 2017; pp. 1-9.

*Primary Examiner* — Ryan W Sherwin

(74) *Attorney, Agent, or Firm* — Cantor Colburn LLP

(57) ABSTRACT

A manual alarm device including a housing and a displacement element mounted in the housing is provided. The displacement element is moveable between a first position and a second position. Only application of a stable force to the displacement element is configured to move the displaceable element between the first position and the second position.

10 Claims, 7 Drawing Sheets

(56) References Cited

FOREIGN PATENT DOCUMENTS

| | | | |
|---|---|---|---|
| DE | 2311519 | A1 | 9/1974 |
| EP | 0053557 | A1 | 6/1982 |
| EP | 0065826 | A1 | 12/1982 |
| EP | 0510917 | A2 | 10/1992 |
| EP | 1503390 | A2 | 2/2005 |
| EP | 1988525 | A2 | 11/2008 |
| EP | 2091032 | A2 | 8/2009 |
| GB | 2366450 | A | 3/2002 |
| GB | 2366451 | A | 3/2002 |
| GB | 2435546 | | 8/2007 |
| GB | 2456327 | A | 7/2009 |
| WO | 2004102502 | A1 | 11/2004 |

* cited by examiner

PUSH PLATE OF MANUAL ALARM DEVICE

CROSS REFERENCE TO RELATED APPLICATIONS

This application claims priority to Chinese Application Serial No. 201510596532.0, filed Sep. 18, 2015, the entire disclosure of which is incorporated herein by reference.

TECHNICAL FIELD

The disclosure relates to a manual alarm device for an alarm system, and more particularly, to a manually operable manual alarm device that can be actuated and then reset.

RELATED ART

One or more manually operable manual alarm devices are usually incorporated into a fire alarm system, which can be actuated by a person finding a fire, to trigger a fire alarm. Such a manual alarm device traditionally includes an element that can be reached through a window. In order to actuate the fire alarm system, a force is applied to the element to cause the element to move and connect an adjacent switch. A state of the manual alarm device can be visually determined easily through simple visual evaluation on the situation of the element.

A conventional manual alarm device generally includes a plurality of friction elements. Similarly, other components also exist which are configured to restrict movement of the elements once actuated. The friction elements usually wear out as the time elapses, and are vulnerable to influences of dirt, dust and debris accumulation, and the accumulation may affect functionality of the manual alarm device and require an additional force for actuation. Moreover, the elements in the conventional manual alarm device can be easy to move and do not provide a mechanism for conducting identification between accidental and intentional actuation. As a result, such a manual alarm device has limited reliability.

SUMMARY

According to an embodiment of the disclosure, a manual alarm device is provided, which includes a housing and a displaceable element mounted in the housing. The displaceable element is moveable between a first position and a second position. Only application of a stable force to the displacement element is configured to move the displaceable element between the first position and the second position.

Other than one or more of the features described above, or as an alternative, in another embodiment, movement of the displaceable element is restricted when the displaceable element is in the second position.

Other than one or more of the features described above, or as an alternative, in another embodiment, a locking piece is configured to restrict movement of the displaceable element from the second position.

Other than one or more of the features described above, or as an alternative, in another embodiment, a biasing force produced by a biasing mechanism is configured to restrict movement of the displaceable element from the second position.

Other than one or more of the features described above, or as an alternative, in another embodiment, an external apparatus is configured to manually release the displaceable element from the second position.

Other than one or more of the features described above, or as an alternative, in another embodiment, the manual alarm device includes a body having at least one mounting arm, and the body is configured to rotate around the mounting arm.

Other than one or more of the features described above, or as an alternative, in another embodiment, a high viscosity material is configured to damp movement of the displaceable element.

Other than one or more of the features described above, or as an alternative, in another embodiment, a part of the at least one mounting arm is received in a bracket, which includes the high viscosity material, of the housing.

Other than one or more of the features described above, or as an alternative, in another embodiment, a biasing mechanism is mounted to the at least one mounting arm. The biasing mechanism is configured to move the displaceable element from the second position to the first position after the displaceable element is manually released.

Other than one or more of the features described above, or as an alternative, in another embodiment, the body includes an upper body and a lower body pivotably linked to a toggle rod.

Other than one or more of the features described above, or as an alternative, in another embodiment, a biasing mechanism is configured to apply a biasing force to the lower body.

Other than one or more of the features described above, or as an alternative, in another embodiment, the body includes an upper body and a lower body connected by at least one flexible chain. The at least one flexible chain is made of a compliant elastic material.

BRIEF DESCRIPTION OF THE DRAWINGS

When the specification concludes, the gist of the disclosure is particularly indicated and clearly asserted in the claims. Through the following detailed description with reference to the accompanying drawings, the foregoing and other features and advantages of the disclosure are evident, in which:

The embodiments of the disclosure as well as advantages and features thereof are described with examples through the detailed description with reference to the accompanying drawings.

DETAILED DESCRIPTION

Figure 1:
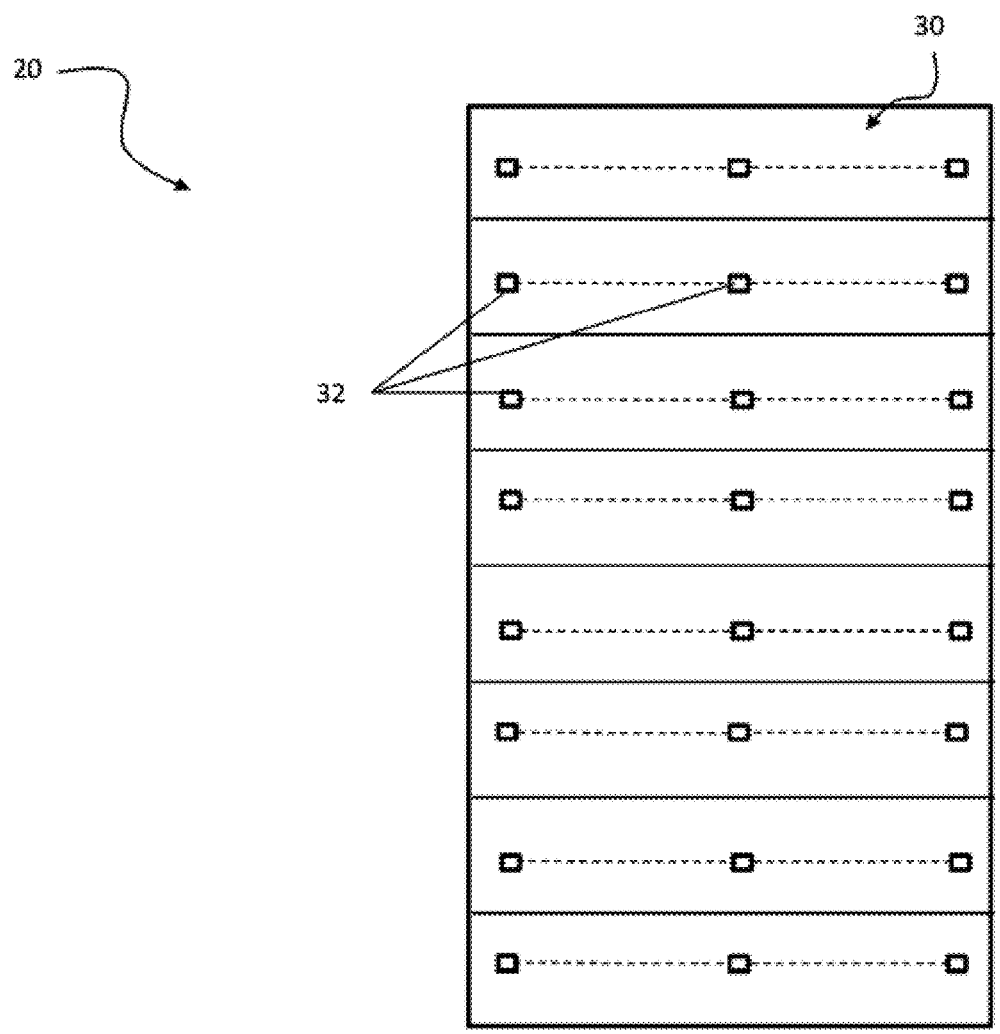
FIG. 1 is a schematic view of a building that includes a fire alarm system.

FIG. 1 illustrates an example of a building 20 that includes a fire alarm system 30. The fire alarm system 30 includes a plurality of manually operable manual alarm devices 32, which are located in various positions throughout the building 20. The plurality of manual alarm devices 32 are operably linked to each other, for example, through a plurality of wires or controllers (not shown). As a result, if one of the plurality of manual alarm devices 32 is actuated to indicate, for example, occurrence of a predetermined emergency of fire, one or more of the manual alarm devices 32 not actuated in other regions of the building 20 can be configured to generate an alarm throughout all or at least part of the building 20.

Figure 2:
FIG. 2 is a perspective view of an example of a manual alarm device of a fire alarm system.

Now referring to FIG. 2, an example of configuration of a manual alarm device 32 for use in the fire alarm system 30 in FIG. 1 is illustrated in more detail. Although the manual alarm device 32 is illustrated and described herein regarding the fire alarm system 30, configuration of the manual alarm device for use in any type of systems is within the scope of the disclosure. In an illustrated and non-restrictive embodiment, the manual alarm device 32 includes a housing 34 which has a removable front cover 36 including an observation widow 38 formed on a front surface thereof. For example, a displaceable element 40 of a push plate is located in the housing 34, and can be reached through the observation widow 38. What is located in the housing 34 and generally adjacent to the displaceable element 40 is a switch (not shown). The displaceable element 40 is manually moveable between a first position and a second position. When the displaceable element 40 moves to the second position, the displaceable element 40 contacts and actuates the switch to indicate an alarm situation. In one embodiment, once actuated, the displaceable element 40 is configured to remain in the second actuated position until an external apparatus is used to manually reset the manual alarm device 32. For example, a key may be inserted into an orifice formed in the housing 34 to reset the manual alarm device 32 and return the displaceable element 40 to the first un-actuated position. However, in other embodiments, the displaceable element 40 can be configured to automatically return to the first un-actuated position when a force applied thereto is removed.

Figure 3:
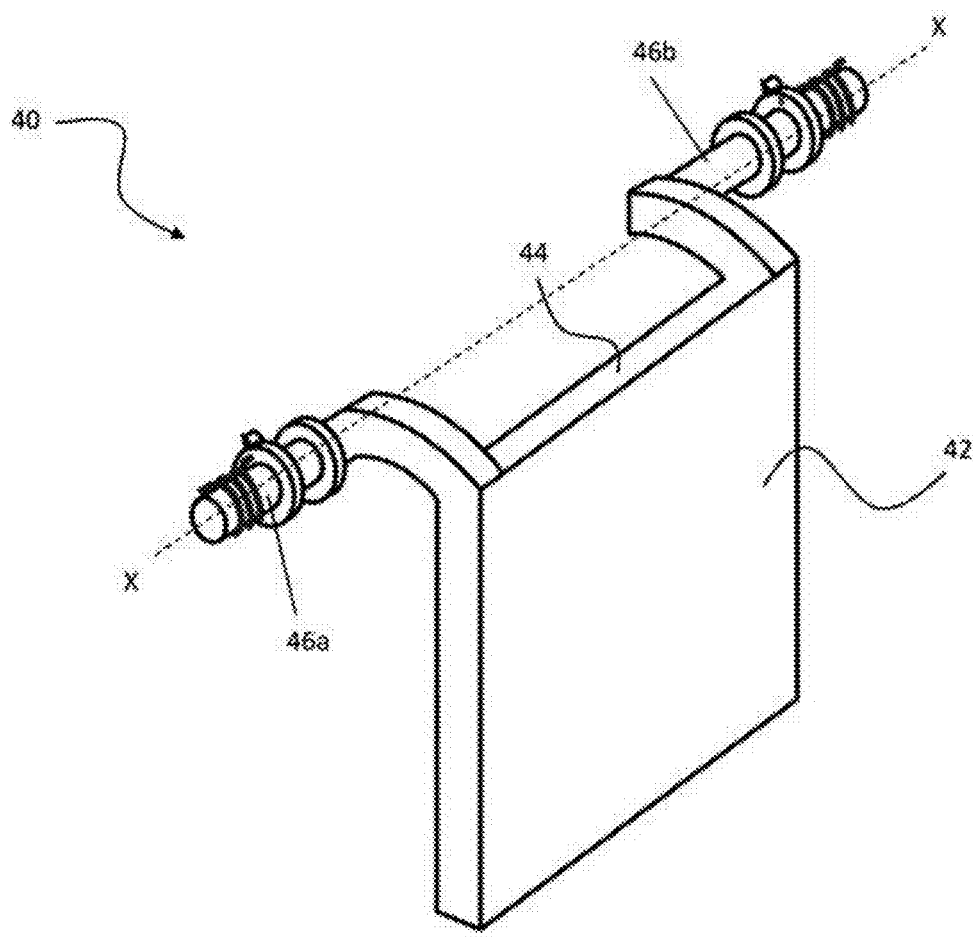
FIG. 3 is a perspective view of a displacement element of a manual alarm device according to an embodiment of the disclosure.
Figure 4:
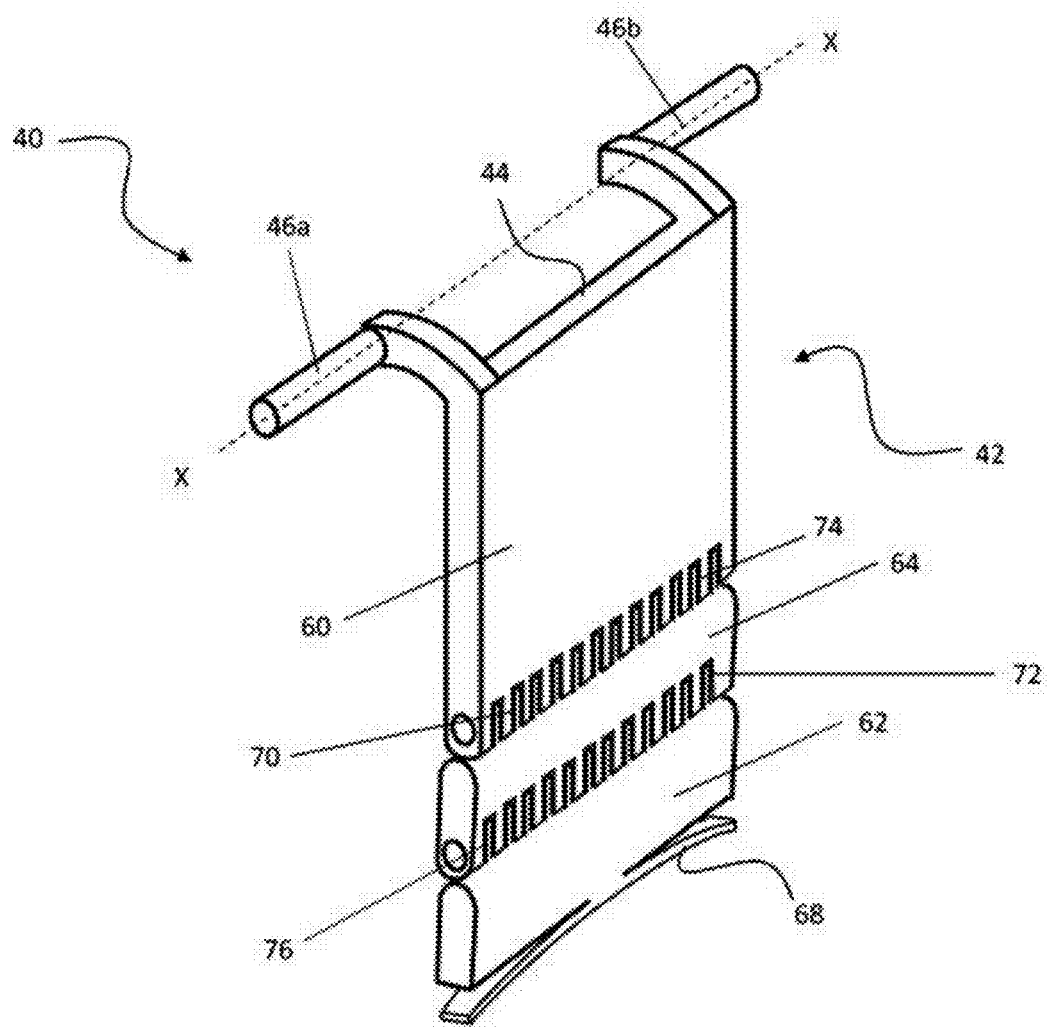
FIG. 4 is a perspective view of another displacement element according to an embodiment of the disclosure.
Figure 5:
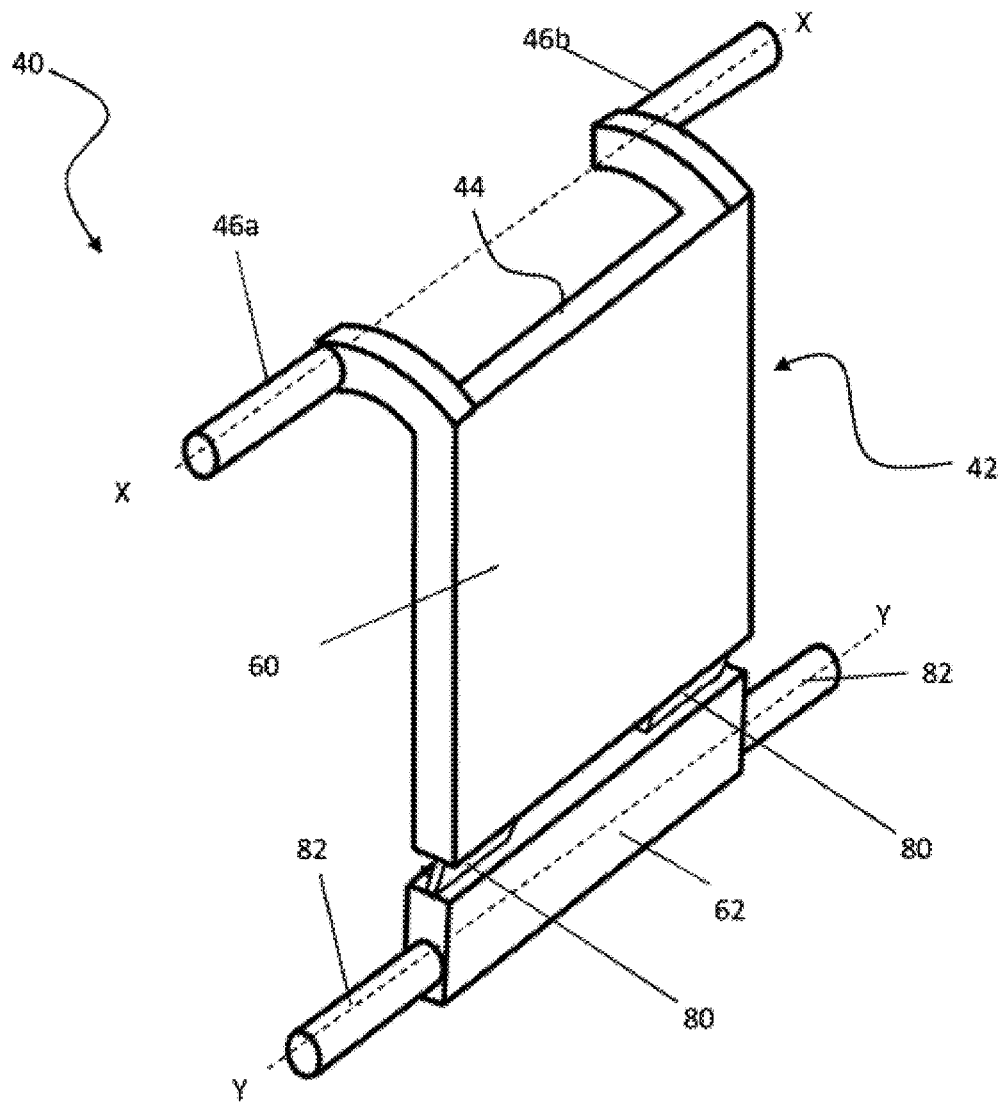
FIG. 5 is a perspective view of another displacement element according to an embodiment of the disclosure.

Now referring to FIGS. 3-5, various embodiments of configuration of a displaceable element 40 for use in the manual alarm device 32 are shown in more detail. In each of FIGS. 3-5, the displaceable element 40 generally includes a flat body 42, which has at least one mounting arm 46 connected to a first end 44 thereof. As illustrated, a first mounting arm 46a and a second mounting arm 46b are connected to a body 44 and extend away from the body 44 in basically opposite directions. The first and second mounting arms 46a and 46b are coaxially arranged so that the body 42 is configured to pivot around an axis X defined by the first and second mounting arms 46a and 46b when the displaceable element 40 is mounted in the housing 34.

Figure 3A:
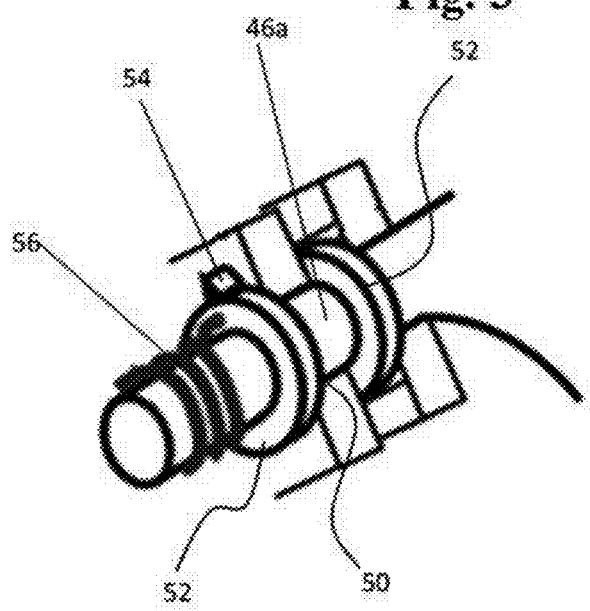
FIG. 3a is a perspective view of part of a displacement element mounted in a housing of a manual alarm device according to an embodiment of the disclosure.

Each of the displaceable elements 40 described herein is configured to minimize actuation due to high impact and accidental contact. Referring to the displaceable element 40 in FIGS. 3 and 3a, when the element 40 is mounted in the housing 34, the at least one mounting arm 46 is received in a bracket 50, which includes a high viscosity material, for example, lubricating grease, of the housing 34. One or more discs 52 (for example, two discs) can be mounted to each of the mounting arms 46 to restrict lateral movement of the displaceable element 40, especially movement of the mounting arm 46 relative to the bracket 50. Each disc 52 defines a plane of shearing the lubricating grease. Therefore, the increased number of the discs 52 increases the number of the planes of shearing the lubricating grease, which thus increases damping stiffness of the displaceable element 40. The high viscosity material is configured to resist sudden rotation of the displaceable element 40 around the axis X of the mounting arms 46a and 46b, which, for example, is produced by high speed impact when people or things involuntarily impact or otherwise contact the displaceable element 40. However, the high viscosity material is configured to provide limited resistance to slower and intentional movement of the displaceable element 40.

A part of the mounting arm 46 is configured to lock the displaceable element 40 in the second actuated position. In one embodiment, at least one of the discs 52 includes a locking piece 54 configured to restrict movement of the displaceable element 40 once pressed down. As described previously, an external apparatus can be used to unlock the locking piece 54, so that the displaceable element 40 can freely rotate from the second actuated position to the first un-actuated position. In one embodiment, for example, a biasing mechanism 56 of a torsion spring is mounted around at least one of the mounting arms 46a and 46b. Once the displaceable element 40 has been unlocked, at least one biasing mechanism 56 is configured to bias the displaceable element 40 back to the first un-actuated position.

Figure 4A:
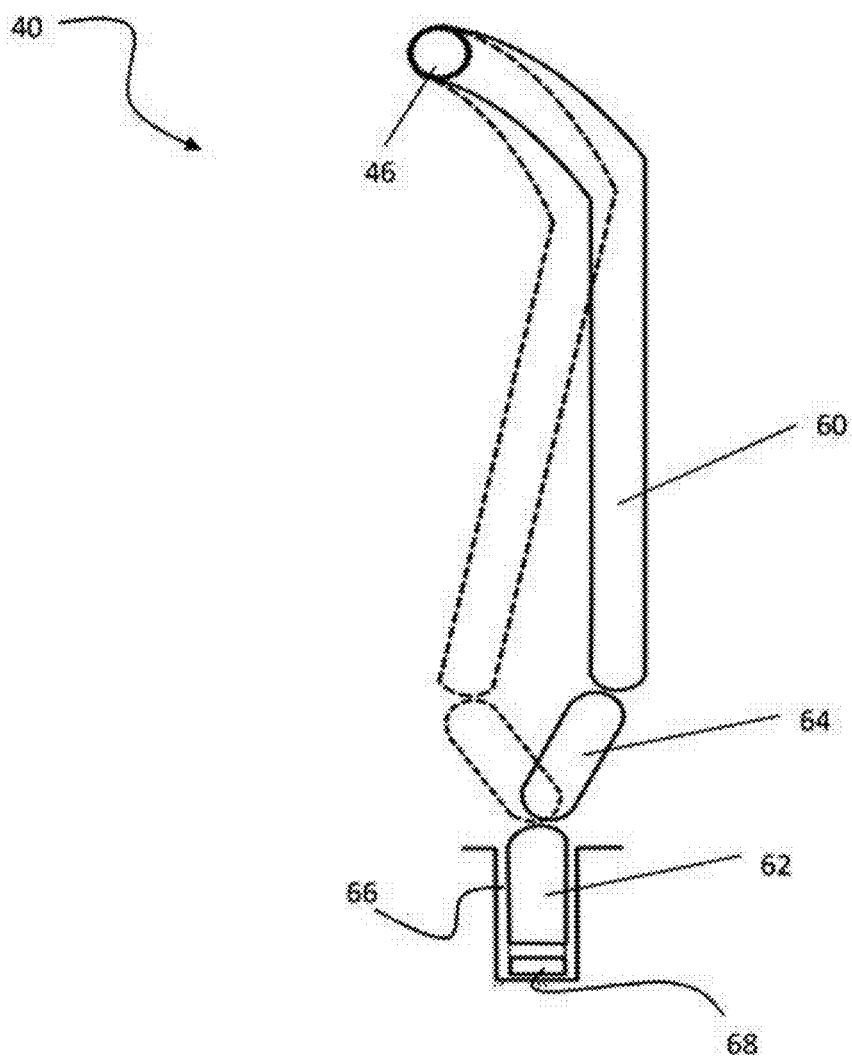
FIG. 4a is a side view of the displacement element in FIG. 4.

Now referring to the displaceable element 40 shown in FIGS. 4 and 4a, the body 42 includes an upper body 60 and a lower body 62 connected by a toggle rod 64. The lower body 62 is generally received in an opening 66 of the housing 34 (refer to FIG. 4a). A biasing mechanism 68 may be arranged in the opening 66 and below the lower body 62. However, in other embodiments, the biasing mechanism 68 may be integrally formed with a part of the lower body 62, as illustrated.

In an illustrated and non-restrictive embodiment, the toggle rod 64 includes a plurality of gear portions 70 extending from a first side thereof and a plurality of openings 72 formed in a second opposite side thereof. However, other embodiments in which the toggle rod 64 only includes a single gear portion 70 are also within the scope of the present invention. The first side of the toggle rod 64 is pivotably linked to the upper body 60, for example, by using a pin, so that the plurality of gear portions 70 are received in a plurality of complementary openings 74 formed in the upper body 60. Similarly, the second side of the toggle rod 64 is rotatably linked to the lower body 62, so that a plurality of gear portions 74 extending from the lower body 62 are received in a plurality of adjacent openings 72 of the toggle rod 64.

A high viscosity damping material, for example, lubricating grease, is located at an interface between the toggle rod 64 and at least one of the upper body 60 and the lower body 62. As described previously, the high viscosity material is configured to resist sudden rotation of the displaceable element 40 around the axis X of the mounting arms 46a and 46b, which, for example, is produced by high speed impact when people or things involuntarily impact or otherwise contact the displaceable element 40. However, the high viscosity material is configured to provide limited resistance to slower and intentional movement of the displaceable element 40. When the displaceable element 40 is intentionally actuated, the toggle rod 64 rotates. Rotation of the toggle rod 64 applies a downward force to the lower body 62 to cause the biasing mechanism 68 to compress. A reactive biasing force of the biasing mechanism 68 causes the toggle rod 64 (and thus the displaceable element 40) to be locked in a proper position in the second actuated position.

Figure 5A:
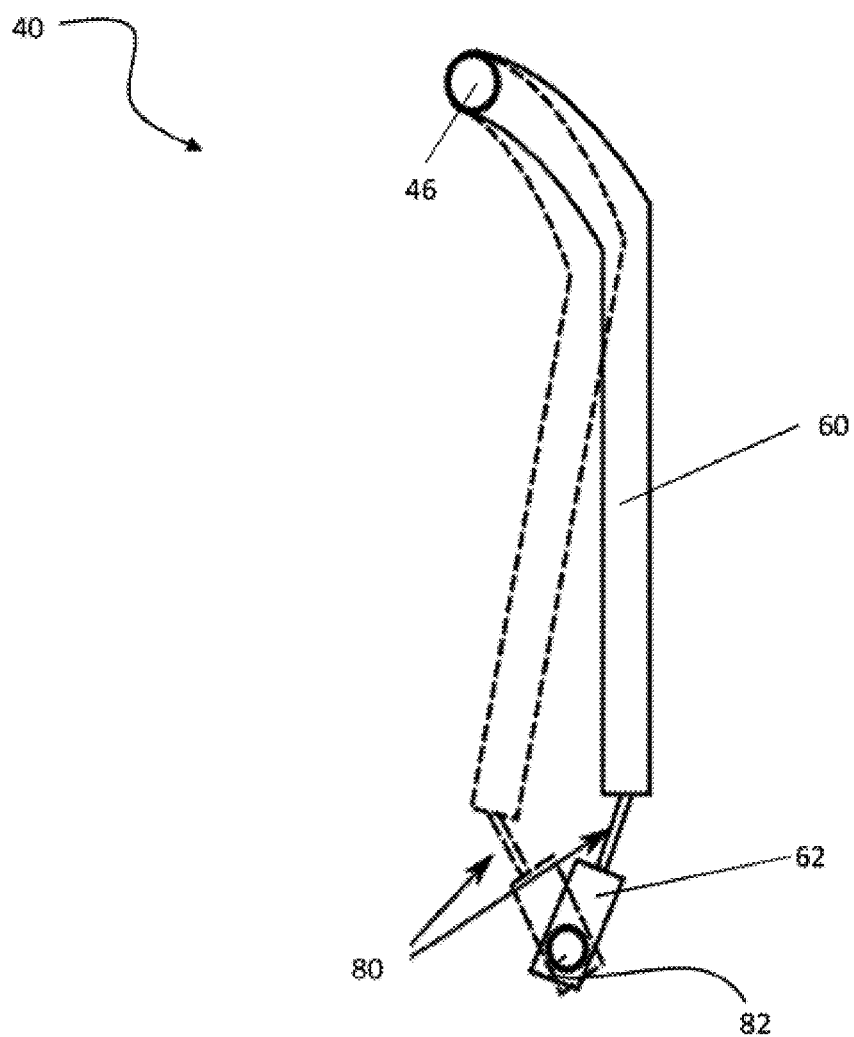
FIG. 5a is a side view of the displacement element in FIG. 5.

Now referring to the displaceable element 40 shown in FIGS. 5 and 5a, the body 42 similarly includes an upper body 60 and a lower body 62 connected together by at least one flexible chain 80. Although shown as two flexible chains 80, any displaceable element 40 including any number of flexible chains 80 is within the scope of the present invention. In an illustrated and non-restrictive embodiment, the lower body 62 includes at least one mounting arm 82 configured to restrict movement of the lower body 62 to rotation around an axis Y defined by the at least one mounting arm 82. The mounting arm 82 may be basically the same as or different from at least one mounting arm 46 connected to the upper body 60.

The at least one flexible chain 80 is made of, for example, a plastic compliant elastic material, and can be connected to the upper and lower bodies 60 and 62 or integrally formed with the upper and lower bodies 60 and 62. The material of the flexible chain 80 is selected from any suitable material having desired flexibility and rigidity. The suitable material will provide sufficient resistance to cause the at least one chain 80 to be configured to operate as a damping mechanism. In one embodiment, the flexible chain 80 is made of a material the same as that of the upper and lower bodies 60 and 62, but has a different section.

The flexible chain 80 is configured to resist sudden rotation of the displaceable element 40 around the axis X of the mounting arms 46a and 46b, which, for example, is produced by high speed impact when people or things involuntarily impact or otherwise contact the displaceable element 40. However, the flexible chain 80 is configured to provide limited resistance to slower and intentional movement of the displaceable element 40. When the displaceable element 40 is intentionally actuated, the upper body 60, the flexible chain 80 and the lower body 62 rotate to the second actuated position. Stiffness of the flexible chain 80 is configured to lock the displaceable element 40 in the second position until an external apparatus is used to manually reset the manual alarm device 32.

The displaceable element 40 disclosed herein has a reduced number of friction elements. In addition, movement of the displaceable element 40 is damped, causing unintentional actuation of the manual alarm device to be significantly reduced. As a result, the overall reliability of the manual alarm device having the displaceable element 40 as described herein is increased.

Although the disclosure has been described in detail only in combination with a finite number of embodiments, it should be easily understood that the disclosure is not limited to the disclosed embodiments. Moreover, the disclosure can be modified to incorporate any number of transformations, variations, replacements and equivalent arrangements not described so far, but they are in line with the spirit and scope of the disclosure. In addition, although various embodiments of the disclosure have been described, it should be understood that various aspects of the disclosure may only include some of the described embodiments. Therefore, the present invention is not regarded as being limited by the foregoing description but is only limited by the scope of the appended claims.

The invention claimed is:

1. A manual alarm device, comprising:
   a housing including a bracket; and
   a displaceable element mounted in the housing, the displaceable element including at least one mounting arm positioned within the bracket, the displaceable element being rotatable about an axis between a first position and a second position;
   a high viscosity material is positioned within the bracket and configured to damp movement of the displaceable element, wherein the high viscosity material resists rotation of the displaceable element between the first position and the second position in response to high speed impact.

2. The manual alarm device according to claim 1, wherein movement of the displaceable element is restricted when the displaceable element is in the second position.

3. The manual alarm device according to claim 2, wherein a locking piece is configured to restrict movement of the displaceable element from the second position.

4. The manual alarm device according to claim 2, wherein a biasing force produced by a biasing mechanism is configured to restrict movement of the displaceable element from the second position.

5. The manual alarm device according to claim 2, wherein an external apparatus is configured to manually release the displaceable element from the second position.

6. The manual alarm device according to claim 5, wherein the body is configured to rotate around the mounting arm.

7. The manual alarm device according to claim 1, wherein a biasing mechanism is mounted to the at least one mounting arm, and the biasing mechanism is configured to move the displaceable element from the second position to the first position after the displaceable element is manually released.

8. The manual alarm device according to claim 1, wherein the body comprises an upper body and a lower body pivotably linked to a toggle rod.

9. The manual alarm device according to claim 8, wherein a biasing mechanism is configured to apply a biasing force to the lower body.

10. A manual alarm device, comprising:
    a housing; and
    a displaceable element mounted in the housing, the displaceable element including a body having at least one mounting arm, the body including an upper body and a lower body connected by at least one flexible chain which is made of a compliant elastic material, wherein the displaceable element is rotatable about an axis defined by the at least one mounting arm between a first position and a second position, wherein the compliant elastic material resists rotation of the displaceable element between the first position and the second position in response to high speed impact.

* * * * *